United States Patent [19]

Kim et al.

[11] Patent Number: 4,852,064
[45] Date of Patent: Jul. 25, 1989

[54] PRECHARGE CIRCUIT FOR USE IN A SEMICONDUCTOR MEMORY DEVICE

[75] Inventors: Byung Y. Kim, Seoul; Tae S. Jung, Buchon; Sang K. Hwang, Kyungsangbuk, all of Rep. of Korea

[73] Assignee: SamSung Electronics Co., Ltd., Suwon, Rep. of Korea

[21] Appl. No.: 207,518

[22] Filed: Jun. 16, 1988

[30] Foreign Application Priority Data

Jun. 27, 1987 [KR] Rep. of Korea ............... 1987-6581

[51] Int. Cl.[4] ............................................. G11C 11/40
[52] U.S. Cl. ................................. 365/203; 365/189.07
[58] Field of Search ..................... 365/203, 189, 230

[56] References Cited

U.S. PATENT DOCUMENTS 4,743,784 5/1988 Ohara et al. ..................... 365/203

Primary Examiner—Terrell W. Fears
Attorney, Agent, or Firm—Robert E. Bushnell

[57] ABSTRACT

A precharge circuit for use in a static random access memory is disclosed two step bit line pair precharging scheme in a precharge cycle performed prior to a read operation. The first precharging step is performed via each drain-source path of N-channel MOS transistor pair to the corresponding bit lines in response to a first pulse generated by the write enable signal and the following second precharging step is performed via means for precharging more dominantly than the transistor pair in response to a second pulse generated by the address transition detection circuit. Owing to the off-state of the N-channel MOS transistor pair in a read operation after a write operation, high speed read operation is obtained.

2 Claims, 2 Drawing Sheets

PRECHARGE CIRCUIT FOR USE IN A SEMICONDUCTOR MEMORY DEVICE

FIELD OF THE INVENTION

The present invention relates to a precharge circuit for use in a semiconductor memory device, and particularly relates to an improved circuit for precharging and equalizing a bit line pair in a static random access memory device.

Conventional SRAM'S are employing an address transition detector (hereinafter referred to as ATD) which generates one-shot pulse when row or column address have changed. Using such one-shot pulse as a base clock for dynamic operations of internal circuits gives advantageous effects of high speed operation and low power dissipation. Therefore, prior to a read operation or a write operation, after a pair of bit lines are precharged and equalized to a predetermined potential level by using the address transition detection pulse, read operation from or write operation into a memory cell is performed fast through the bit line pair. However, the latest trend of fast SRAM'S goes toward high density and SRAR'S require long extended bit line pairs. As a result, since parasitic capacitance of each bit line becomes high, the power consumption due to the precharge of bit line pairs performed just before the write operation or the read operation becomes too large to ignore. Also, after the completion of the write operation, where the successive read operation will be performed into an other memory cell coupled to the same bit line pair, since the potential difference between the bit line pair due to the prior write operation is large, the failure of sufficient precharge and equalization of the bit line pair to a desired potential level can incur the problem that causes to erroneously change the stored data of the memory cell selected to be subjected to the following read operation.

FIG. 1 illustrates a conventional precharge circuit diagram. Referring to FIG. 1, a memory cell 1 is coupled between a true bit line BL and a complement bit line $\overline{BL}$ and is selected by signal on a word line WL. A precharge circuit 2 comprises a P-channel MOS transistor T3 for equalizing the bit line pair BL and $\overline{BL}$ in response to a clock pulse $\overline{EQ}$ generated from the ATD pulse, a pair of P-channel MOS transistors T1 and T2 each source-drain path of which is coupled between the power supply source potential Vcc and respective one of bit lines BL and $\overline{BL}$ for precharging the bit line pair in response to the pulse $\overline{EQ}$ and a pair of P-channel MOS transistors T4 and T5 whose gates are coupled to the ground potential and whose source-drain paths are respectively connected in parallel with the transistors T1 and T2 for flowing the current to bit lines BL and $\overline{BL}$. Since the precharge circuit 2 includes transistors T4 and T5 which are always remained at turn-on states, the current flowing to the bit line pair is always dissipated when changes of addresses arise for a long cycle. On the other hand, the read operation performed after the write operation must be undertaken after the bit line pair is precharged to the same potential level with only three transistors T1 through T3 coupled to the clock pulse $\overline{EQ}$. Because the bit line difference after a write operation is large, each of transistors T1 through T3 must be designed to a large size enough to pull-up bit line pairs and then the peak current via those transistors is increased.

A prior precharge circuit to reduce such current dissipation and peak current is shown in FIG. 9 at page 938 of IEEE Journal of Solid-State Circuits, VOL. SC-20, No. 5, October 1985. That circuit is employing P-channel MOS transistors T2 which is turned off in the write operation and is turned on in the read operation to prevent the current disspitation with a write enable signal WE2. Such precharge scheme using P-channel MOS transistors T2 turned on in the read operation has a problem of requiring a long access time to develop the potential difference between the bit line pair by a desired value (about 0.5–0.2 volts) necessary to read from a selected memory cell.

SUMMARY OF THE INVENTION

Accordingly, an object of this invention is to provide an improved precharge circuit which is able to perform the reduction of current dissipation as well as that of peak current without loss of operation speed in a read operation after a write operation.

To attain above object, the present invention is to provide a precharge circuit for a static random access memory including a pair of bit lines (BL, $\overline{BL}$), a plurality of memory cells coupled between the bit line pair, a first means coupled between the power supply source and respective one of the bit line pair for precharging the bit line pair in response to a first clock pulse ($\phi$WE) provided by a write enable pulse in a precharge cycle performed prior to a read operation, a second means (11, 12, 13) coupled between the bit line pair for precharging and equalizing the bit line pair in response to a second clock pulse ($\overline{EQ}$) provided by an address transition detection pulse in the precharge cycle, a pair of diode-connected transistor means coupled between the power supply source and respective ones of the bit line pair and normaly turned on, characterized in that said first precharging means comprises a pair of N-channel MOS transistors (16, 17) whose gates are coupled to the first clock pulse and whose drain-source paths are coupled between the power supply source and respective ones of the bit line pair, wherein said transistor pair precharge the bit line pair to a predetermined potential value in response to said first clock pulse in the precharge cycle performed prior to a read operation and thereafter said second precharging and equalizing means successively precharges the bit line pair in response to the second clock pulse more dominantly than said transistor pair.

BRIEF DESCRIPTION OF THE DRAWINGS

The present invention will be better understood from the following detailed descriptions taken in conjunction with the accompanying drawings in which.

DETAILED DESCRIPTION OF THE INVENTION

Figure 1:
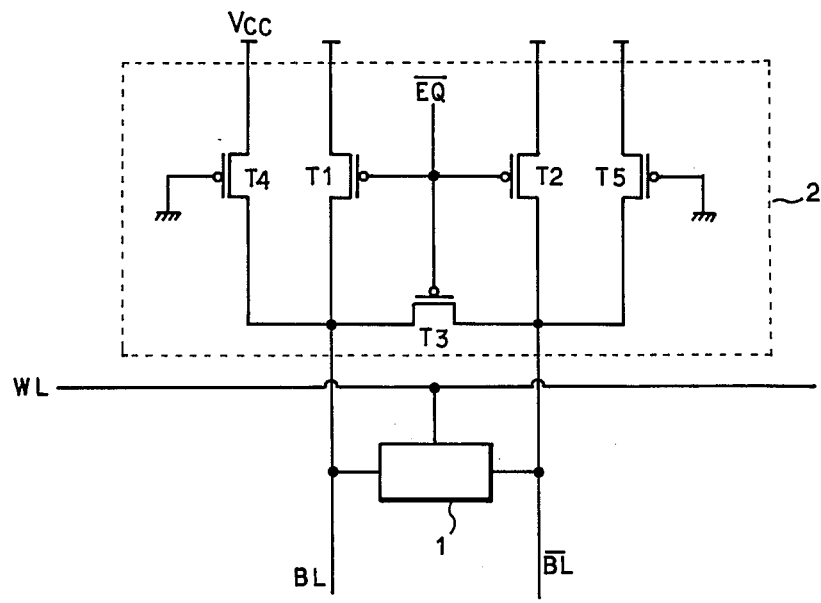
FIG. 1 is a conventional precharge circuit diagram in a semiconductor memory device.
Figure 2:
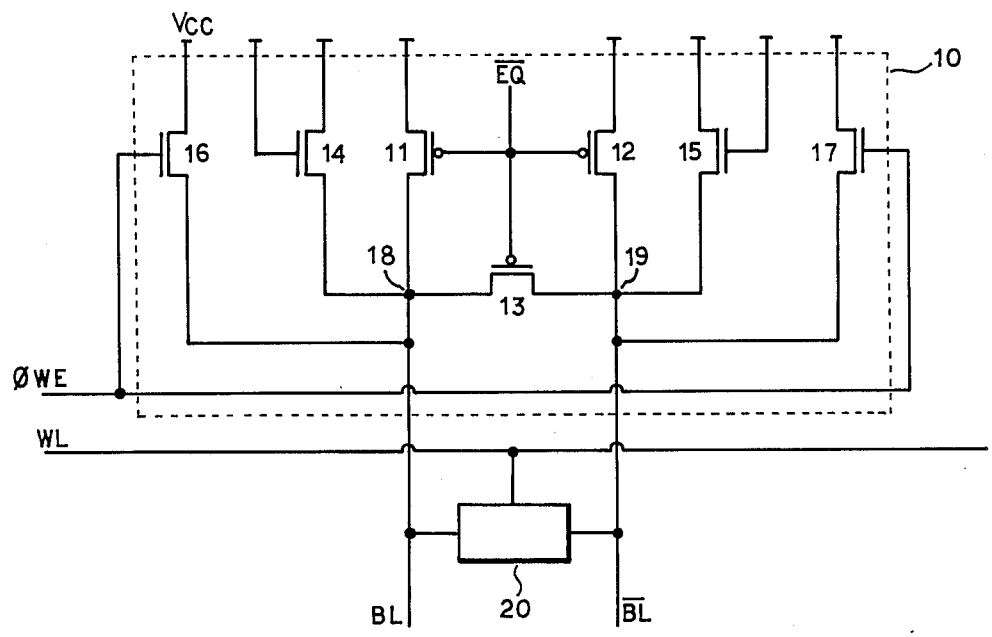
FIG. 2 is a precharge circuit diagram of the present invention.

Referring to FIG. 2, there is shown therein a precharge circuit for precharging and equalizing a pair of bit lines BL and $\overline{BL}$ according to the present invention. The precharge circuit 10 comprises a P-channel MOS transistor 13 coupled between the bit line pair BL and $\overline{BL}$ for equalizing both of the bit lines BL and $\overline{BL}$ in response to a clock pulse $\overline{EQ}$, a pair of P-channel MOS transistors 11 and 12 whose source-drain paths respectively are coupled between the power supply source potential Vcc (5 volts) and nodes 18 and 19 for precharging the bit line pair BL and $\overline{BL}$ in response to the pulse $\overline{EQ}$, a pair of N-channel MOS transistors 14 and 15 whose gates are coupled to the power supply source potential and whose drain-source paths are respectively connected in parallel with the transistors 11 and 12 and a pair of N-channel transistors 16 and 17 whose gates are coupled to a clock pulse $\phi$WE and whose drain-source paths are respectively coupled in parallel with the transistors 14 and 15 for precharging the bit line pair to a predetermined level prior to a read operation after a write operation. Memory cell 20 is like the memory cell 1 in FIG. 1.

Figure 3:
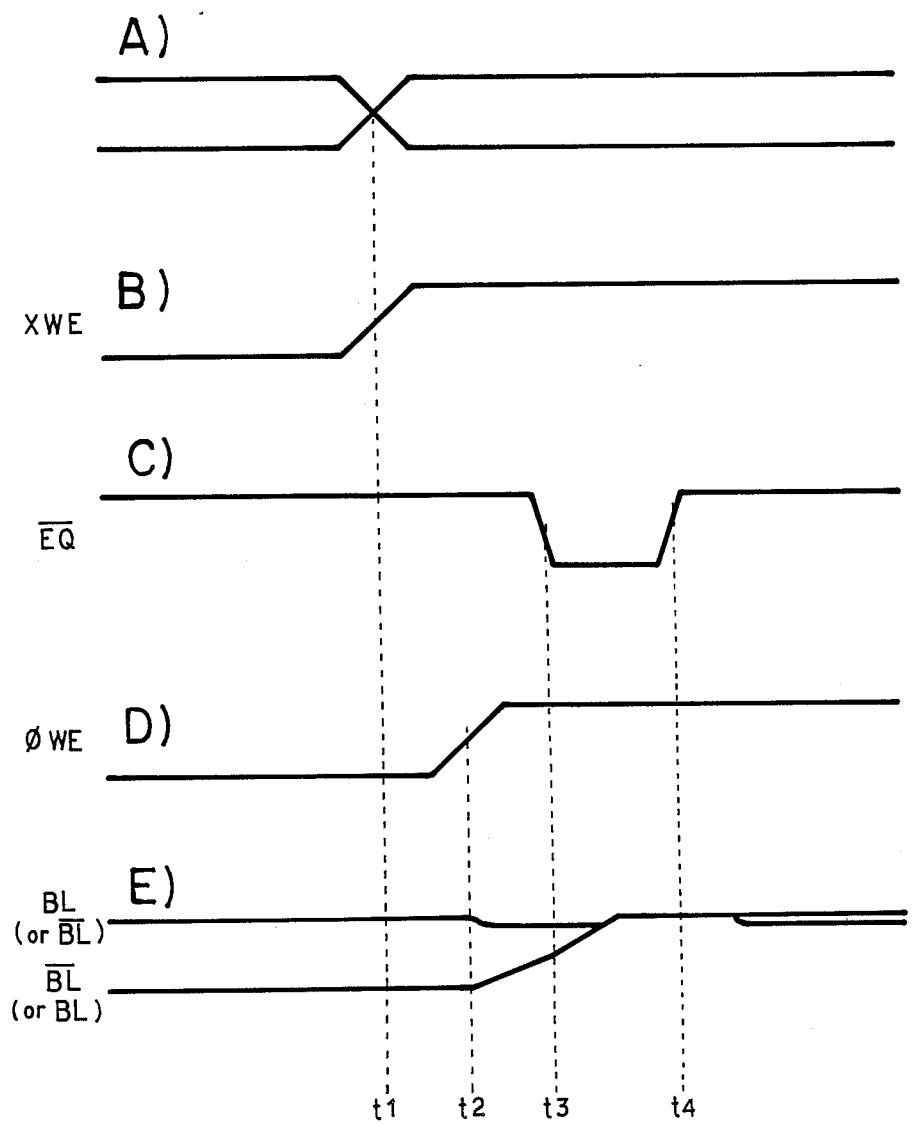
FIG. 3 is a timing chart explanatory of the operation of the present invention shown in FIG. 2.

Referring to FIG. 3, FIG. 3(A) is a timing diagram of an address signal supplied from the external chip, FIG. 3(B) that of an write enable signal $\phi$WE, FIG. 3(C) that of the equalization pulse $\overline{EQ}$ provided by the ATD pulse, FIG. 3(D) that of the pulse $\phi$WE provided by signal $\overline{XWE}$ and finally FIG. 3(E) depicts level states of the bit line pair.

Hereinbelow, the precharge circuit in FIG. 2 will be described in detail in connection with the timing diagrams of FIG. 3.

Now, assume that, at a time t1, an address signal XAi varies and the write enable signal $\overline{XWE}$ changes from a write operation mode into a read operation mode, i.e., from a low state into a high state. Then, N-channel MOS transistors 16 and 17 is turned on at a time t2 by the pulse $\phi$WE generated by signal $\overline{XWE}$, by which the bit line $\overline{BL}$ is precharged to a predetermined level at time t3. After time t3, by the pulse $\overline{EQ}$ generated by ATD pulse, both bit lines BL and $\overline{BL}$ are precharged. Each of transistors 14 and 15 turned on at all times provides so sufficient currents to the bit line pair BL and $\overline{BL}$ as to compensate for the leakage of that for a long cycle operation. Transistors 16 and 17 are turned off during the write operation by the low state of the pulse $\phi$WE and are turned on in the precharge time prior to the read operaton by the high state of $\phi$WE. Therefore, during the precharge time (t2-t4) performed after the write operation and prior to the read operation, transistor 15 or 14 coupled to the bit line with the low level is turned on to precharge the low level bit line by the high state of $\phi$WE between time t2 and t3. The bit line with the low level is precharged at time t3 by approximately a potential of Vcc-3Vth, wherein Vth is an absolute value (about 0.8 volts) of threshold voltages of P-channel MOS transistors and N-channel MOS transistors. At time t3, transistors 11 through 13 are turned on in response to the low state of the pulse $\overline{EQ}$. Therefore, since the transistor 11 or 12 coupled in series to the bit line with the low state becomes more dominantly conductive than the transistor 16 or 17 between the time t3 and t4, and bit line with the low state is precharged to the power supply voltage Vcc via the transistor 11 or 12 and the bit line pair is equalized via the transistor 13. As a result, using the precharged scheme of two steps described above reduces the peak current as well as the size of transistors 11 through 13. Also, at time t4, when both of the bit lines BL and $\overline{BL}$ were precharge dto Vcc, transistors 11 through 13 are turned off by the pulse $\overline{Eq}$ going toward the high state and transistors 16 and 17 are turned off. Therefore, after time t4, since transistors 14 and 15 are turned on to compensate for the leakage currents of the bit line pair and remaining transistors of the precharge circuit 10 are all turned off, the voltage difference between the bit line pair due to the charge sharing of stored data in the memory cell 20 selected by the word line W to the bit line pair can be developed fast by the sensible voltage from an output sense amplifier not shown. By such operation of the precharge circuit, the read operation can be fast after the write operation.

As described above, the present invention is able to minimize the current dissipation in the long cycle by employing transistors having high resistance and has effects of not only the reduced peak current in the precharging time, but also the rapid write recovery after the write operation and prior to the read operation by using N-channel transistors turned off in the write operation and turned on in the precharging time prior to the read operation in response to the pulse $\phi$WE generated by the write enable signal.

What is claimed is:

1. A precharge circuit for a static random access memory including a pair of bit lines (BL, $\overline{BL}$), a plurality of memory cells coupled between the bit line pair, a first means coupled between the power supply source and respective one of the bit line pair for precharging the bit line pair in response to a first clock pulse ($\phi$WE) provided by a write enable pulse in a precharge cycle performed prior to a read operation, a second means (11, 12, 13) coupled between the bit line pair for precharging and equalizing the bit line pair in response to a second clock pulse ($\overline{EQ}$) provided by an address transition detection pulse in the precharge cycle, a pair of diode-connected transistor means coupled between the power supply source and respective ones of the bit line pair and normally turned on, characterized in that said first precharging means comprises a pair of N-channel MOS transistors (16, 17) whose gates are coupled to the first clock pulse and whose drain-source paths are coupled between the power supply source and respective ones of the bit line pair, wherein said transistor pair precharge the bit line pair to a predtermined potential value in response to said first clock pulse in the precharge cycle performed prior to a read operation and thereafter said second precharging and equalizing means successively precharges the bit line pair in response to the second clock pulse more dominantly than said transistor pair.

2. A precharge circuit as cited in claim 1, characterized in that each of said diode-connected transistor means is an N-channel MOS transistor (14 or 15) whose gate is coupled to the power supply source, said transistor having a high resistance so as to compensate for the leakage current of each of the bit lines.

* * * * *